US009462724B2

(12) United States Patent
Godrich et al.

(10) Patent No.: US 9,462,724 B2
(45) Date of Patent: Oct. 4, 2016

(54) CONVERGENT ENERGIZED IT APPARATUS FOR COMMERCIAL USE

(75) Inventors: Kfir Godrich, Morganville, NJ (US); William Thayer, Los Gatos, CA (US); Arne Ballantine, Palo Alto, CA (US)

(73) Assignees: BLOOM ENERGY CORPORATION, Sunnyvale, CA (US); HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 917 days.

(21) Appl. No.: 13/533,070

(22) Filed: Jun. 26, 2012

(65) Prior Publication Data

US 2012/0327592 A1  Dec. 27, 2012

Related U.S. Application Data

(60) Provisional application No. 61/501,599, filed on Jun. 27, 2011.

(51) Int. Cl.
*H05K 7/20* (2006.01)
*H05K 7/14* (2006.01)

(52) U.S. Cl.
CPC .......... *H05K 7/1492* (2013.01); *Y10T 307/414* (2015.04)

(58) Field of Classification Search
CPC ............ H05K 7/1492; Y10T 307/406; Y10T 307/414; Y10T 307/422; Y10T 307/43; Y10T 307/438
USPC ........................................ 307/64–66, 31–35
See application file for complete search history.

(56) References Cited

U.S. PATENT DOCUMENTS

| | | | |
|---|---|---|---|
| 4,935,642 A * | 6/1990 | Obelode | H02J 3/14 307/32 |
| 5,424,903 A * | 6/1995 | Schreiber | G06F 1/266 307/40 |
| 6,781,249 B2 * | 8/2004 | Holder et al. | 290/1 A |
| 7,250,231 B2 * | 7/2007 | Edlund | 429/429 |
| 7,634,667 B2 | 12/2009 | Weaver et al. | |
| 7,691,502 B2 | 4/2010 | Wallace et al. | |
| 7,705,490 B2 | 4/2010 | Srinivasan et al. | |
| 7,713,649 B2 | 5/2010 | Hickey et al. | |
| 7,880,323 B2 | 2/2011 | Menges | |
| 7,919,953 B2 | 4/2011 | Porter et al. | |
| 8,216,732 B2 | 7/2012 | Lam | |
| 8,434,804 B2 | 5/2013 | Slessman | |
| 8,618,456 B2 | 12/2013 | Hinman et al. | |
| 8,648,481 B2 | 2/2014 | Menges | |
| 2002/0086194 A1 * | 7/2002 | Blaszczyk et al. | 429/26 |
| 2002/0134098 A1 * | 9/2002 | Feeney | 62/259.2 |
| 2004/0180253 A1 | 9/2004 | Fisher | |

(Continued)

*Primary Examiner* — Fritz M Fleming
(74) *Attorney, Agent, or Firm* — The Marbury Law Group PLLC

(57) ABSTRACT

Various embodiments include a combined power and IT modular system including a housing, an IT load, and a DC power generator which is electrically connected to the IT load, wherein the IT load and the DC power generator are both located in the housing. Further embodiments include a method of operating a combined power and IT module including step of providing a combined power and IT module including a housing, an IT load, and a DC power generator which is electrically connected to the IT load, wherein the IT load and the DC power generator are both located in the housing, and operating the DC power generator to supply power to the IT load.

42 Claims, 13 Drawing Sheets

(56) References Cited

U.S. PATENT DOCUMENTS

| | | |
|---|---|---|
| 2004/0219415 A1* | 11/2004 | Brignone et al. ............... 429/34 |
| 2006/0210841 A1 | 9/2006 | Wallace et al. |
| 2007/0254193 A1* | 11/2007 | Lam ............................... 429/12 |
| 2007/0284885 A1 | 12/2007 | Menges |
| 2009/0072624 A1 | 3/2009 | Towada |
| 2009/0246566 A1* | 10/2009 | Craft et al. .................... 429/13 |
| 2010/0043870 A1 | 2/2010 | Bennett et al. |
| 2010/0085788 A1* | 4/2010 | Zacharias et al. ............ 363/123 |
| 2010/0139887 A1 | 6/2010 | Slessman |
| 2010/0295383 A1 | 11/2010 | Cummings |
| 2011/0061015 A1* | 3/2011 | Drees et al. .................. 715/771 |
| 2011/0281185 A1 | 11/2011 | Sridhar et al. |
| 2011/0316337 A1 | 12/2011 | Pelio et al. |
| 2012/0189940 A1 | 7/2012 | Richards et al. |
| 2012/0327592 A1 | 12/2012 | Godrich et al. |

\* cited by examiner

CONVERGENT ENERGIZED IT APPARATUS FOR COMMERCIAL USE

CROSS-REFERENCE TO RELATED APPLICATIONS

This application claims the benefit of priority to U.S. Provisional Patent Application Ser. No. 61/501,599 filed Jun. 27, 2011, which is hereby incorporated herein by reference in its entirety.

BACKGROUND

Information technology ("IT") loads are often deployed in racks or cabinets that in most markets may consume 4-6 KW per rack on average. Technology is getting denser with some racks going over 40 KW per rack and even higher for high-performance computing applications. Applications in the range of 8-35 KW are becoming more and more popular with blade servers, heavy storage, and networking being integrated for mobility reasons.

Cloud computing is allowing utilization of more distributed configurations with better utilization of existing data centers, public clouds and new private clouds created in a way that is allowing optimal operation for enterprises or the SMB market by allowing the "Everything as a Service" way of utilization for the cloud consumer. The "Infrastructure as a Service" models are better synchronized to the requirements of businesses, therefore there exists a need in the market for building blocks for such infrastructure that will allow overall faster time to market at optimal cost.

As shown in FIG. 1, a prior art fuel cell system may includes a DC load module 102 including a data center rack or other IT load 102B connected to a power supply 102A, an input/output module 104, and one or more power modules 106. The modules may be connected by a DC bus 112, such as a 380V DC line. The DC load module 102 may also be connected to a grid line 114, such as a 480V AC line.

The input/output module 104 may comprise one or more power conditioning components 104A. The power conditioning components 104A may include components for converting DC power to AC power, such as a DC/AC inverter (e.g., a DC/AC inverter described in U.S. Pat. No. 7,705,490, incorporated herein by reference in its entirety), electrical connectors for AC power output to the grid, circuits for managing electrical transients, a system controller (e.g., a computer or dedicated control logic device or circuit), etc. The power conditioning components may be designed to convert DC power from the fuel cell modules to different AC voltages and frequencies. Designs for 208V, 60 Hz; 480V, 60 Hz; 415V, 50 Hz and other common voltages and frequencies may be provided.

Each power module 106 cabinet is configured to house one or more hot boxes. A hot box is an insulated container for storing the high temperature components of a fuel cell system. Each hot box contains one or more stacks or columns of fuel cells 106A (generally referred to as "segments"), such as one or more stacks or columns of solid oxide fuel cells having a ceramic oxide electrolyte separated by conductive interconnect plates. Other fuel cell types, such as PEM, molten carbonate, phosphoric acid, etc. may also be used.

Fuel cells are often combined into units called "stacks" in which the fuel cells are electrically connected in series and separated by electrically conductive interconnects, such as gas separator plates which function as interconnects. A fuel cell stack may contain conductive end plates on its ends. A generalization of a fuel cell stack is the so-called fuel cell segment or column, which can contain one or more fuel cell stacks connected in series (e.g., where the end plate of one stack is connected electrically to an end plate of the next stack). A fuel cell segment or column may contain electrical leads which output the direct current from the segment or column to a power conditioning system. A fuel cell system can include one or more fuel cell columns, each of which may contain one or more fuel cell stacks, such as solid oxide fuel cell stacks.

The fuel cell stacks may be internally manifolded for fuel and externally manifolded for air, where only the fuel inlet and exhaust risers extend through openings in the fuel cell layers and/or in the interconnect plates between the fuel cells, as described in U.S. Pat. No. 7,713,649, which is incorporated herein by reference in its entirety. The fuel cells may have a cross flow (where air and fuel flow roughly perpendicular to each other on opposite sides of the electrolyte in each fuel cell), counter flow parallel (where air and fuel flow roughly parallel to each other but in opposite directions on opposite sides of the electrolyte in each fuel cell) or co-flow parallel (where air and fuel flow roughly parallel to each other in the same direction on opposite sides of the electrolyte in each fuel cell) configuration.

Power modules 106 may also comprise other generators of direct current, such as solar cell, wind turbine, geothermal, or hydroelectric power generators.

The segment(s) 106A of fuel cells may be connected to one or more DC buses 112, such as split DC bus(es), by one or more DC/DC converters 106B located in module 106. Alternatively, the DC/DC converters 106B may be located in the input/output module 104 instead of the power modules 106.

The system may also optionally include an energy storage module 108 with one or more storage devices 108A, such as a bank of supercapacitors, flywheels, or batteries. The storage device 108A may also be connected to the DC bus 112 using one or more DC/DC converters 108B as shown in FIG. 1. Alternatively, the storage devices 108A may be located in the power module 106 and/or together with the IT load 102.

The fuel cell system and the grid 114 may be electrically connected to the power supply 102A of the IT load module 102. The power supply 102A may include a control logic unit and an AC/DC converter to convert back up power from the grid 114 to DC power in case power from modules 106 is not available or not sufficient.

FIGS. 2 and 5 illustrate an exemplary prior art modular fuel cell system described in U.S. provisional application Ser. No. 61/386,257, filed Sep. 24, 2010, and U.S. non-provisional application Ser. No. 13/242,194, both titled "Fuel Cell Mechanical Components", which are incorporated by reference in their entirety for the disclosure of this system. This modular system is referred to as a "Bloom Box" or "BB" for brevity in the Detailed Description section below.

The modular system may contain modules and components described above as well as in U.S. patent application Ser. No. 11/656,006, filed on Jan. 22, 2007, and incorporated herein by reference in its entirety. The modular design of the fuel cell system enclosure 10 provides flexible system installation and operation. Modules allow scaling of installed generating capacity, reliable generation of power, flexibility of fuel processing, and flexibility of power output voltages and frequencies with a single design set. The modular design results in an "always on" unit with very high availability and reliability. This design also provides an easy means of scale up and meets specific requirements of customer's installations. The modular design also allows the use of available fuels and required voltages and frequencies which may vary by customer and/or by geographic region.

The modular fuel cell system enclosure 10 includes a plurality of power module housings 12 (containing a fuel cell power module components, where the housing 12 and its components correspond to the power module 106 in FIG. 1), one or more fuel input (i.e., fuel processing) module housings 16, and one or more power conditioning (i.e., electrical output) module housings 18 (where the housing 18 and its contents correspond to the input/output module 104 in FIG. 1). For example, the system enclosure may include any desired number of modules, such as 2-30 power modules, for example 6-12 power modules. FIG. 2 illustrates a system enclosure 10 containing six power modules (one row of six modules stacked side to side), one fuel processing module, and one power conditioning module, on a common base 20. Each module may comprise its own cabinet or housing. Alternatively, as will be described in more detail below, the power conditioning (i.e., input/output module) and fuel processing modules may be combined into a module located in one cabinet or housing 14. For brevity, each housing 12, 14, 16, 18 will be referred to as "module" below.

While one row of power modules 12 is shown, the system may comprise more than one row of modules 12. For example, the system may comprise two rows of power modules stacked back to back.

Each power module 12 is configured to house one or more hot boxes 13. Each hot box contains one or more stacks or columns of fuel cells (not shown for clarity), such as one or more stacks or columns of solid oxide fuel cells having a ceramic oxide electrolyte separated by conductive interconnect plates. Other fuel cell types, such as PEM, molten carbonate, phosphoric acid, etc. may also be used.

The fuel cell stacks may comprise externally and/or internally manifolded stacks. For example, the stacks may be internally manifolded for fuel and air with fuel and air risers extending through openings in the fuel cell layers and/or in the interconnect plates between the fuel cells.

Alternatively, the fuel cell stacks may be internally manifolded for fuel and externally manifolded for air, where only the fuel inlet and exhaust risers extend through openings in the fuel cell layers and/or in the interconnect plates between the fuel cells, as described in U.S. Pat. No. 7,713,649, which is incorporated herein by reference in its entirety. The fuel cells may have a cross flow (where air and fuel flow roughly perpendicular to each other on opposite sides of the electrolyte in each fuel cell), counter flow parallel (where air and fuel flow roughly parallel to each other but in opposite directions on opposite sides of the electrolyte in each fuel cell) or co-flow parallel (where air and fuel flow roughly parallel to each other in the same direction on opposite sides of the electrolyte in each fuel cell) configuration.

The modular fuel cell system enclosure 10 also contains one or more input or fuel processing modules 16. This module 16 includes a cabinet which contains the components used for pre-processing of fuel, such as desulfurizer beds. The fuel processing modules 16 may be designed to process different types of fuel. For example, a diesel fuel processing module, a natural gas fuel processing module, and an ethanol fuel processing module may be provided in the same or in separate cabinets. A different bed composition tailored for a particular fuel may be provided in each module. The processing module(s) 16 may processes at least one of the following fuels selected from natural gas provided from a pipeline, compressed natural gas, methane, propane, liquid petroleum gas, gasoline, diesel, home heating oil, kerosene, JP-5, JP-8, aviation fuel, hydrogen, ammonia, ethanol, methanol, syn-gas, bio-gas, bio-diesel and other suitable hydrocarbon or hydrogen containing fuels. If desired, a reformer 17 may be located in the fuel processing module 16. Alternatively, if it is desirable to thermally integrate the reformer 17 with the fuel cell stack(s), then a separate reformer 17 may be located in each hot box 13 in a respective power module 12. Furthermore, if internally reforming fuel cells are used, then an external reformer 17 may be omitted entirely.

The modular fuel cell system enclosure 10 also contains one or more power conditioning modules 18. The power conditioning module 18 includes a cabinet which contains the components for converting the fuel cell stack generated DC power to AC power (e.g., DC/DC and DC/AC converters described in U.S. Pat. No. 7,705,490, incorporated herein by reference in its entirety), electrical connectors for AC power output to the grid, circuits for managing electrical transients, a system controller (e.g., a computer or dedicated control logic device or circuit). The power conditioning module 18 may be designed to convert DC power from the fuel cell modules to different AC voltages and frequencies. Designs for 208V, 60 Hz; 480V, 60 Hz; 415V, 50 Hz and other common voltages and frequencies may be provided.

The fuel processing module 16 and the power conditioning module 18 may be housed in one input/output cabinet 14. If a single input/output cabinet 14 is provided, then modules 16 and 18 may be located vertically (e.g., power conditioning module 18 components above the fuel processing module 16 desulfurizer canisters/beds) or side by side in the cabinet 14.

As shown in one exemplary embodiment in FIG. 2, one input/output cabinet 14 is provided for one row of six power modules 12, which are arranged linearly side to side on one side of the input/output module 14. The row of modules may be positioned, for example, adjacent to a building for which the system provides power (e.g., with the backs of the cabinets of the modules facing the building wall). While one row of power modules 12 is shown, the system may comprise more than one row of modules 12. For example, as noted above, the system may comprise two rows of power modules stacked back to back.

The linear array of power modules 12 is readily scaled. For example, more or fewer power modules 12 may be provided depending on the power needs of the building or other facility serviced by the fuel cell system 10. The power modules 12 and input/output modules 14 may also be provided in other ratios. For example, in other exemplary embodiments, more or fewer power modules 12 may be provided adjacent to the input/output module 14. Further, the support functions could be served by more than one input/output module 14 (e.g., with a separate fuel processing module 16 and power conditioning module 18 cabinets). Additionally, while in one embodiment, the input/output module 14 is at the end of the row of power modules 12, it could also be located in the center of a row of power modules 12.

The modular fuel cell system enclosure 10 may be configured in a way to ease servicing of the system. All of the routinely or high serviced components (such as the consumable components) may be placed in a single module to reduce amount of time required for the service person. For example, the purge gas and desulfurizer material for a natural gas fueled system may be placed in a single module (e.g., a fuel processing module 16 or a combined input/output module 14 cabinet). This would be the only module cabinet accessed during routine maintenance. Thus, each module 12, 14, 16, and 18 may be serviced, repaired or removed from the system without opening the other module cabinets and without servicing, repairing or removing the other modules.

For example, as described above, the enclosure 10 can include multiple power modules 12. When at least one power module 12 is taken off line (i.e., no power is generated by the stacks in the hot box 13 in the off line module 12), the remaining power modules 12, the fuel processing module 16 and the power conditioning module 18 (or the combined input/output module 14) are not taken off line. Furthermore, the fuel cell enclosure 10 may contain more than one of each type of module 12, 14, 16, or 18. When at least one module of a particular type is taken off line, the remaining modules of the same type are not taken off line.

Thus, in a system comprising a plurality of modules, each of the modules 12, 14, 16, or 18 may be electrically disconnected, removed from the fuel cell enclosure 10 and/or serviced or repaired without stopping an operation of the other modules in the system, allowing the fuel cell system to continue to generate electricity. The entire fuel cell system does not have to be shut down if one stack of fuel cells in one hot box 13 malfunctions or is taken off line for servicing.

Each of the power modules 12 and input/output modules 14 include a door 30 (e.g., hatch, access panel, etc.) to allow the internal components of the module to be accessed (e.g., for maintenance, repair, replacement, etc.). According to one embodiment, the modules 12 and 14 are arranged in a linear array that has doors 30 only on one face of each cabinet, allowing a continuous row of systems to be installed abutted against each other at the ends. In this way, the size and capacity of the fuel cell enclosure 10 can be adjusted with additional modules 12 or 14 and bases 20 with minimal rearranging needed for existing modules 12 and 14 and bases 20. If desired, the door to module 14 may be on the side rather than on the front of the cabinet.

As shown in FIG. 3, the door 30 may open in tandem with a substantially vertical and then substantially horizontal swing (e.g., "gull-wing" style). In other words, the door 30 opens by being moved up and then at least partially over the top of the enclosure 10 in a substantially horizontal direction. The terms substantially vertical and substantially horizontal of this embodiment include a deviation of 0 to 30 degrees, such as 0 to 10 degrees from exact vertical and horizontal directions, respectively.

The door 30 is mounted on to walls of the enclosure or cabinet 10 of the module 12 or 14 with plural independent mechanical arms, such as two arms 50 and two arms 54. FIG. 3 shows one arm 50 and one arm 54 on the right side of the cabinet 10. The corresponding arms 50 and 54 on the left side of the cabinet 10 are obscured by the right side arms and thus not visible in the side view of FIG. 3. Thus, two arms 50 and 54 are provided on either side of the door 30 for a total of four arms. The first arm 50 includes a first, generally straight end 51 and a second, generally curved end 52. The second arm 54 includes a first, generally curved end 55 and a second, generally straight end 56. The second arm 54 is longer than the first arm and has a more pronounced curvature at one end. The ends 51 and 55 are coupled to the interior surface of a wall of the enclosure 10 at a fixed distance relative to each other. The ends 52 and 56 are coupled to the door 30 at a fixed distance relative to each other. End 51 is located closer to the door than end 55. End 52 is located above end 56 on the door.

In the open position shown in FIG. 3, the upper portion of the door 30 may be located over the enclosure or cabinet 10 and the lower portion of the door may optionally overhang the opening to the enclosure 10. In this configuration, the door 30 provides rain and snow protection for a user when open since the lower portion of the door overhangs from the fuel cell system enclosure 10. Alternatively, the entire door 30 may be located over the enclosure 10 in the open position.

As shown in FIG. 4, field replaceable power module components 70 include the hot box sub-system 13, such as the cylindrical hot box 13 that is shown in FIG. 2. The hot box 13 contains the fuel cell stacks and heat exchanger assembly. The power module components 70 also includes a frame 71 supporting the balance of plant sub-system including blowers, valves, and control boards, etc (not shown for clarity) and a removable support 72, such as fork-lift rails, which supports the hot box and the frame. The support 72 allows the power module components 70 to be removed from the power module 12 cabinet as a single unit or assembly.

Other configurations may also be used. For example, the hot box 13 may have a shape other than cylindrical, such as polygonal, etc. The support 72 may comprise a platform rather than rails. The frame may have a different configuration or it may be omitted entirely with the balance of plant components mounted onto the hotbox 13 and/or the support 72 instead. The power module components 70 are dimensionally smaller than the opening in the power module 12 (e.g., the opening closed by the door 30).

FIG. 5 is a photograph of a prior art enclosure 10 with the door sealed.

SUMMARY OF THE INVENTION

Various embodiments include a combined power and IT modular system including a housing, an IT load, and a DC power generator which is electrically connected to the IT load, wherein the IT load and the DC power generator are both located in the housing.

Further embodiments include a method of operating a combined power and IT module including step of providing a combined power and IT module including a housing, an IT load, and a DC power generator which is electrically connected to the IT load, wherein the IT load and the DC power generator are both located in the housing, and operating the DC power generator to supply power to the IT load.

DETAILED DESCRIPTION

Various embodiments provide systems and methods for a combined power and IT module with a DC power generator and an IT load integrated into the same housing. The DC power generator may be electrically connected to the IT load and supply power to the IT load.

The DC power generator may be any type of generator that produces DC electrical power. In various embodiments, the DC power generator is a fuel cell power generation system, such as a solid oxide fuel cell power generation system. For example, some embodiment modules that combine IT loads into a Bloom Box described above may be referred to as a "Bloom Box Data Center" (abbreviated as "BBDC") for brevity. While fuel cells are described herein as an example power source (i.e., the fuel cells in a Bloom Box), any other DC power source, such as a microturbine, etc. may be used instead or in addition to one or more fuel cells. Thus, the IT load, which may be a DC IT load, is integrated into the same housing as its DC power generator.

IT load may refer to any information technology components, such as servers, storage devices, or network components. An IT load (i.e., devices operating in an IT system which may include one or more of computer(s), server(s), router(s), rack(s), power supply connections, and other components found in a data center environment) and IT system are distinguished from devices, such as computers, servers, routers, racks, controllers, power supply connections, and other components used to monitor, manage, and/or control the operation of DC power generators and DC power generation systems in that IT loads do not monitor, manage, and/or control the operation of any DC power generators or DC power generation systems that provide power to the IT loads themselves.

Figure 1:
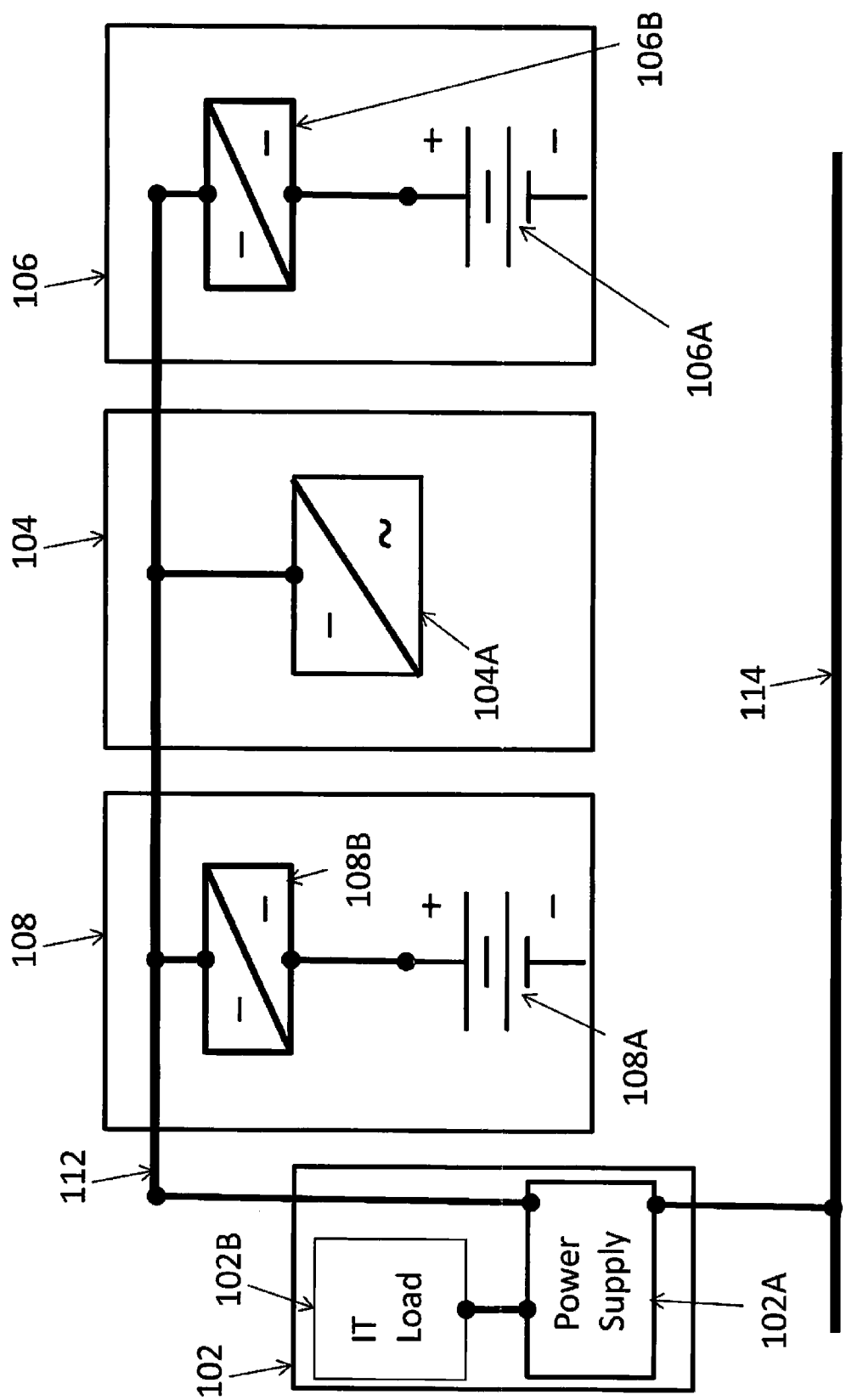
FIG. 1 is a block diagram illustrating a prior art system.
Figure 2:
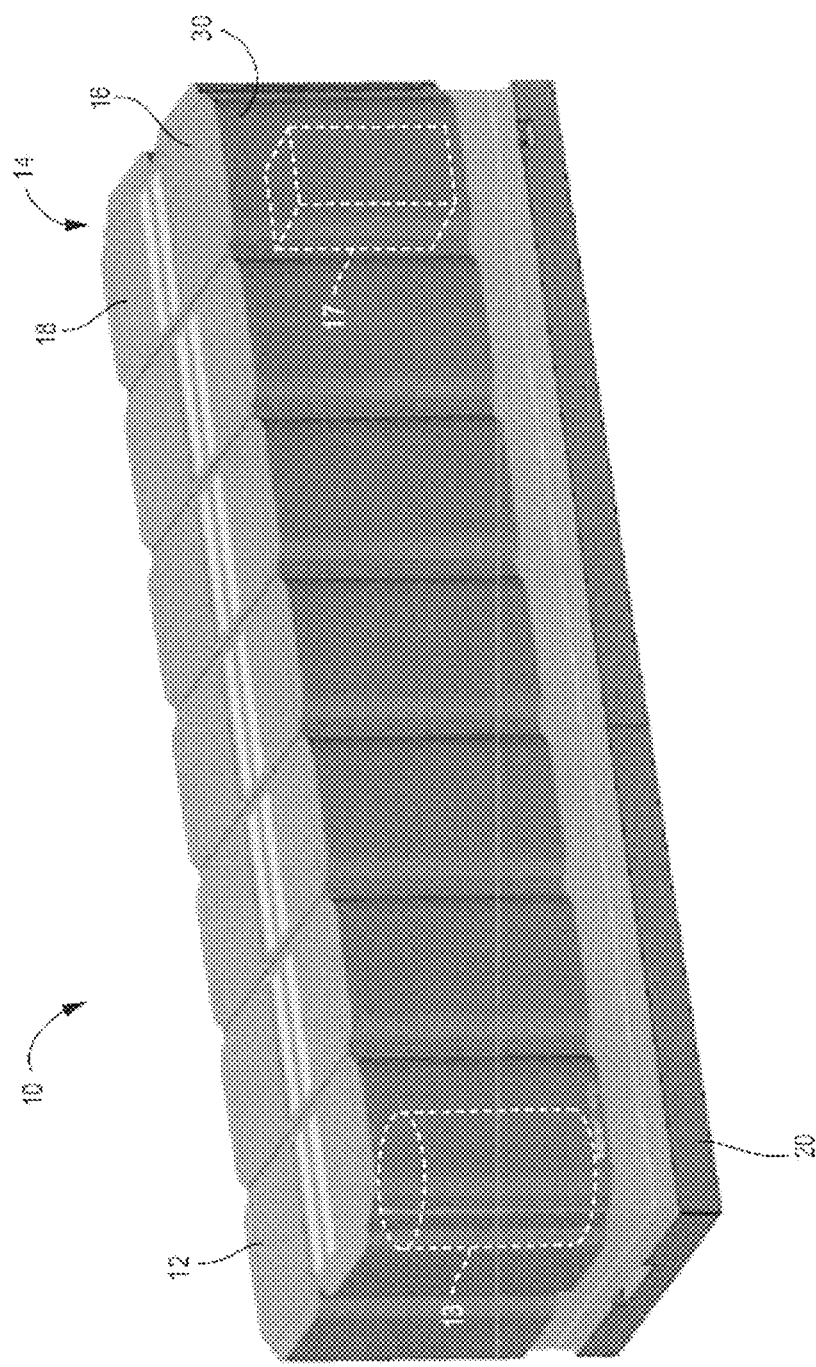
FIG. 2 is an isometric view of a prior art modular fuel cell system enclosure that can be used with the exemplary embodiments.
Figure 3:
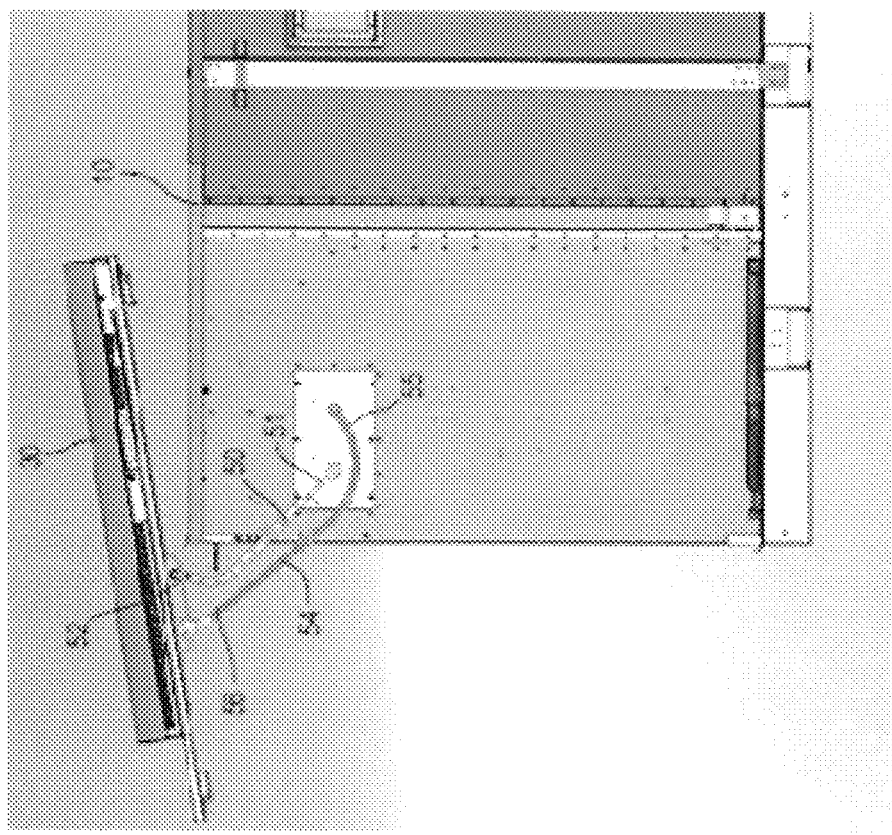
FIG. 3 is a side view of an open door of the prior art system of FIG. 2.
Figure 4:
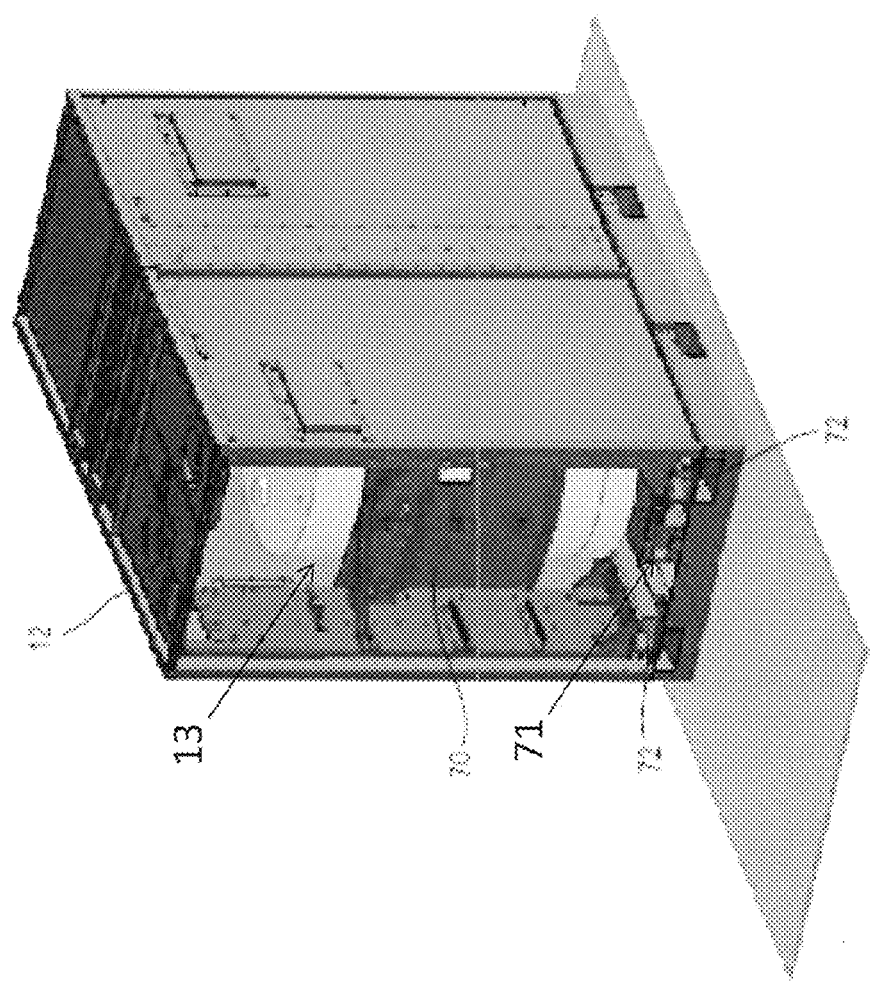
FIG. 4 is an isometric view of a hot box of the prior art modular fuel cell system of FIG. 2.
Figure 5:
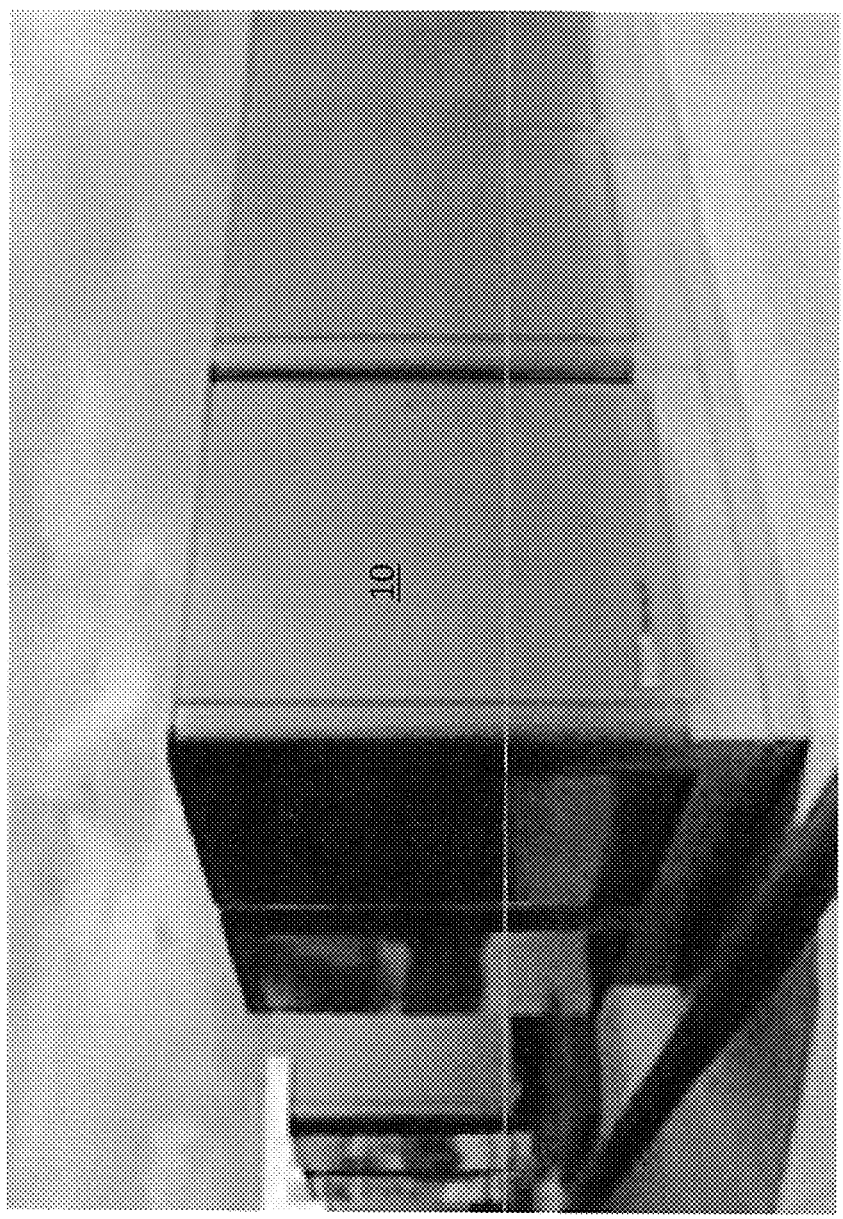
FIG. 5 is photograph of the housing of the prior art modular fuel cell system of FIG. 2.
Figure 6:
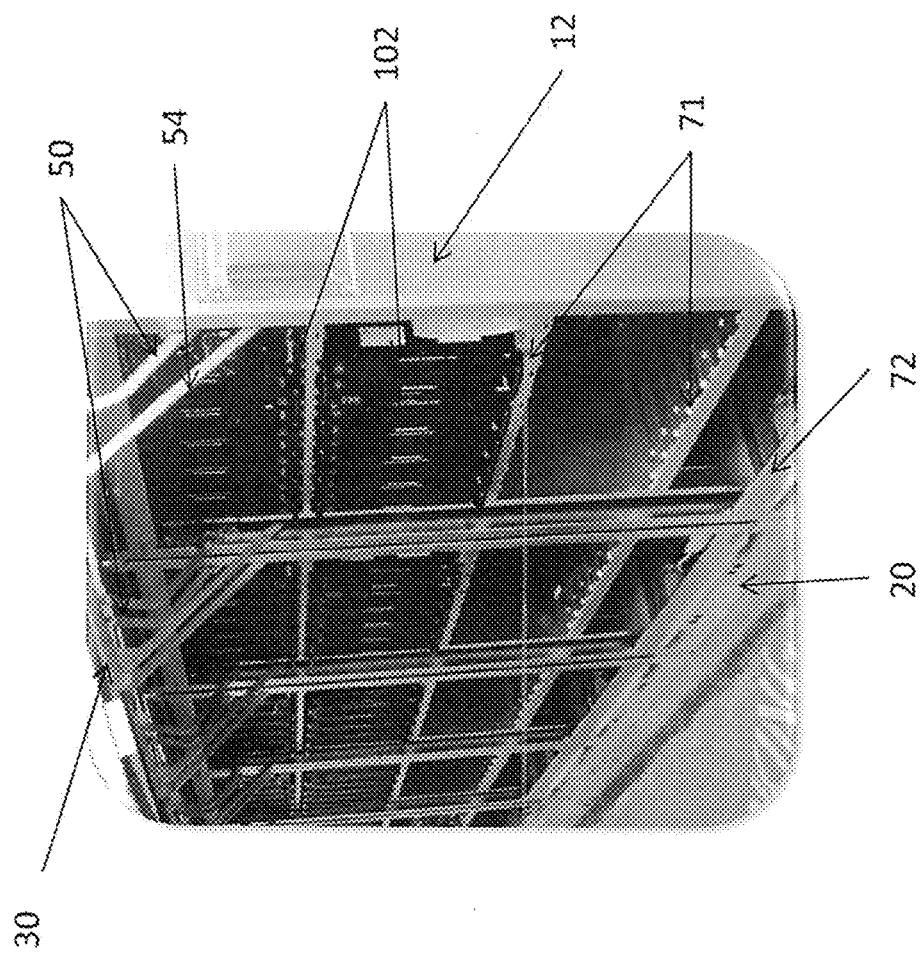
FIG. 6 is an isometric view and FIG. 7 is a side cross sectional view of embodiments of the invention.
Figure 7:
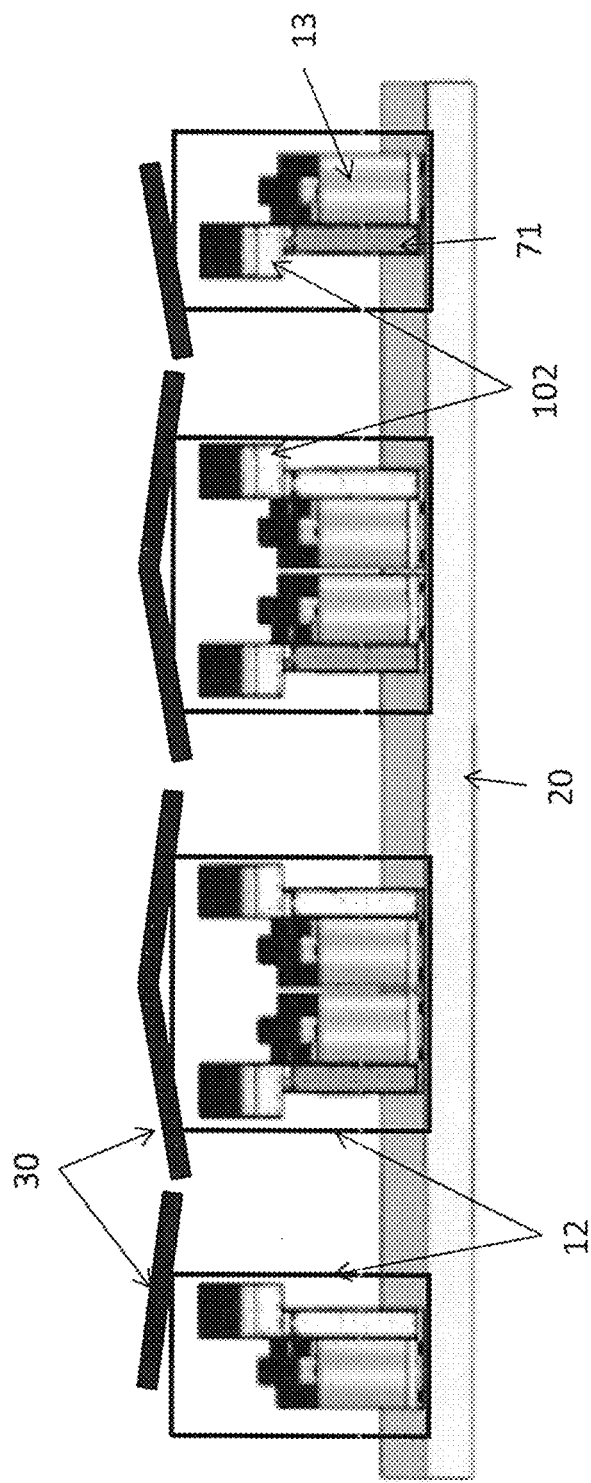

For example, FIGS. 6 and 7 illustrate embodiments of the invention in which the IT load 102 is located in the same housing 12 as a fuel cell hot box 13. In other words, the IT load 102, such as a rack of computer servers, data storage, network components (e.g., routers), etc. and its associated power supply 102A are located in the same power module housing 12 as the power module components 70 (e.g., the hot box 13 and frame 71 supporting balance of plant components). Alternatively, the IT load 102 may be located in the power conditioning module housing 18 or in the common input/output module housing 14 together with the input/output module components (e.g., inverter 104A) and/or fuel processing module components (e.g., desulfurizer beds).

Main sources of energy are typically separated from IT infrastructure (servers, storage, network components, etc.). IT infrastructure may be hosted in racks of data centers, or telecommunications or data central offices that require an environment with adequate power available and HVAC (heating, ventilation, and air conditioning). These previous solutions may utilize a utility grid and generators as power sources, uninterruptible power supply systems for power conditioning, and several stages of transformations (e.g., substations to power distribution units to remote power panels, from MV (medium voltage) level down to LV (low voltage) level, AC to DC or vice versa, etc.) for matching the IT power requirements. Data centers and central offices may utilize an array of HVAC components, including chillers, computer room air conditioners, pumps and heavy piping. Containerized solutions might concentrate some of the functions and even eliminate some but are generally distributed in several containers for the total solution.

In contrast, various embodiments of this invention concentrate one or more of the above functions into a single module that generates power while conditioning and operating IT racks. Various embodiments integrate the functions into the BB (Bloom Box) described above and illustrated in FIGS. 2-5. However, other power generators may be used. Thus, the embodiments of the invention relate generally to energy devices, such as alternative energy or green devices, operating in closed coupling with IT infrastructure creating an integrated and complete Data Center function.

The various embodiment modules may respond to the powering requirements of the market by being able to scale from tens of KWs to MWs in a straightforward way (i.e., by adding or removing modules). The various embodiment modules may allow total integration of IT racks in the BB housing and provide a new building block for the IT world enabling utilization of a simple row of modules to scale IT needs from racks, to rows, to mega-scale data centers while totally controlling not only complexity and sprawl, but also cost with rigorous standardization.

Figure 8:
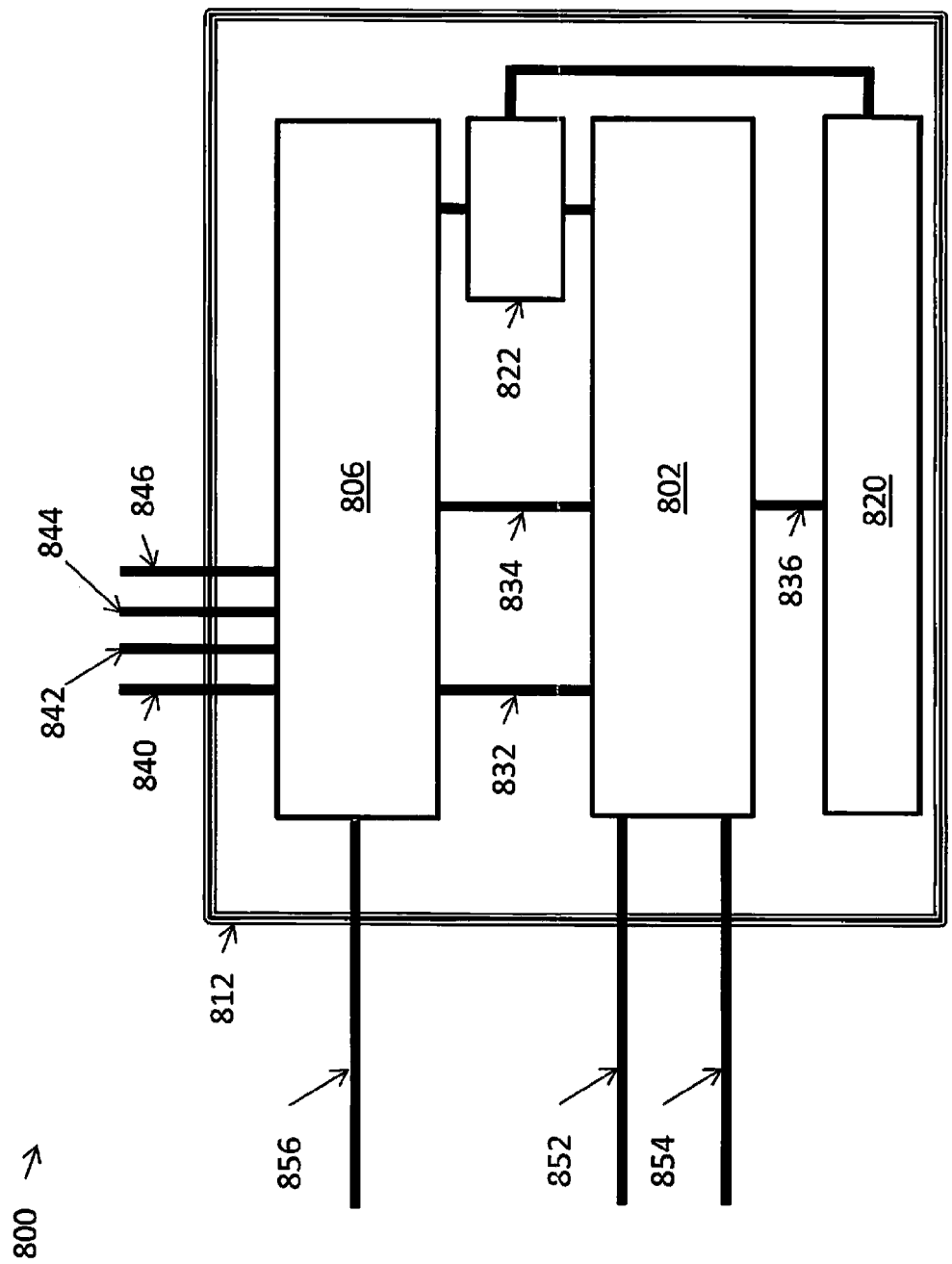
FIG. 8 is a schematic diagram of an embodiment module.

FIG. 8 illustrates a block diagram of an embodiment combined power and IT module 800 including a DC power generator 806 (e.g., a fuel cell system) and an IT load 802 (e.g., one or more servers, network components, etc.) integrated into a single housing 812. Although the IT load is shown integrated into a housing 812 with a power generator 806, in alternate embodiments the IT load may be integrated into the same housing as a power conditioning module or an input/output module.

The DC power generator 806 and IT load 802 may be electrically connected by a power connection 832 through which the DC power generator provides power to the IT load 802. For example, the DC power generator may be configured to supply the IT load with bipolar 380V DC power, unipolar 48V DC power, or unipolar 24V DC power. In various embodiments, one or more DC/DC converters (not shown) may be included in the module 800 (e.g., integrated into the DC power generator 806 or IT load 802) to condition power into any form necessary.

In alternate embodiments, AC power (e.g., to or from the grid) may be used. For example, the module 800 may include a DC/AC inverter (not shown), such as part of the DC generator 806 or IT load 802. The DC power generator may be configured to supply DC power to the inverter and the inverter may be configured to supply AC power to the IT load and/or the grid. The IT load 802 may include an AC/DC converter (i.e., rectifier) for converting AC power from the inverter, from the grid, or from a separate source (e.g., any secondary power source outside the module).

Receiving DC power directly from the generator 806 via connection 832 may eliminate the need for a power regulation unit (and its associated heat) in the IT load 802 and therefore separate cooling in the IT load 802 may not be necessary. Alternately, the module 800 may also include a cooling system 820. The cooling system 820 may include one or more fans (e.g., "3U" type fans or equivalent mounted in the front door or a wall of the module 800). The fans may be configured to direct air to cool the IT load 802. For example, fans may draw air into the cooling system from outside the module 800 at various rates, such as 500-1,500

CFM, for example around 1,000 CFM. The cooling system may then circulate the air, such as blowing the air over the IT load 802.

Air may enter the module 800 through low pressure drop doors (i.e., air entrances that help prevent air from going back out). A positive pressure may be maintained within the housing 812. Air flow direction may vary through the module, such as front to back, back to front, or paths with multiple directions.

The module may also include a controller 822. The fans may be controlled and monitored by the controller 822. Alternately, the controller 822 may be programmed or configured to regulate the power generator 806 or IT load 802. For example, the controller 822 may be configured to shut off the IT load whenever one or more fans ceased operating. This may prevent operation of electrical equipment without positive pressure. In alternate embodiments, the cooling system 820 may include more fans than needed for cooling so that the IT load could continue operating even if a fan ceased operating.

In further embodiments, the controller 822 may be configured to adjust the operation of the at least one fan based on a sensor. For example, the controller could adjust fan speed or other performance based on pressure sensors, flow speed sensors, or fan tachometers.

The cooling system 820 may include various components for treating or processing air or cooling fluid flow. For example, the cooling system 820 may also include one or more moist membranes to cool or filter incoming air. The cooling system 820 may also include a cyclone separator to filter incoming air.

The cooling system 820 may control the environment within the module 800 with compliance with ASHRAE standards or inside the hardware manufacturer's bands of utilization to enable optimal efficiency. For example, the IT load 802 may be kept at 10-35 C.

Supplemental cooling device may be used. In further embodiments, the module may also include a trim cooler, chiller, pre-chiller, and/or water circulation system for additional cooling. These components may be integrated into the cooling system 820 or separate within the module 800.

In various embodiments, the IT load 802 and the DC power generator 806 may be thermally integrated. For example, the module may be configured such that air heated by the IT load 802 is provided to the DC power generator 806. The DC power generator 806 may have a fuel inlet 840, fuel exhaust 842, air inlet 844, and air exhaust 846. Air used to cool the IT load 802 may be routed into the air inlet 844 or directly into part of the DC power generator 806. For example, air taken in and routed by the cooling system 820 with fans may flow to the IT load via conduit 836, cool the IT load 802, and then flow to the DC power generator 806 via conduit 834.

Alternately, the module 800 may be configured such that air heated by the DC power generator 806 is provided to the IT load 802. For example, hot air may be routed from inside the DC power generator 806 or from the air exhaust 846 to the IT load 802.

The IT load 802 may have a data connection 852 leading outside of the module, such as a fiber optic or other network cable. The IT load 802 may also have a secondary power connection 854. The IT load 802 may receive power via power connection 854 (e.g., connected to the grid) for various reasons, such as a B-side feed and/or in case the DC power generator 806 fails. Alternately, power via power connection 854 if the IT load's need for power exceeds the amount of power provided by the DC power generator 806. Alternately, power from the secondary power connection 854 may be used if it is less expensive than power from the fuel cell (i.e., the cost of the fuel cell's fuel exceeds the cost of whatever fuel is used by the source of power for the secondary power connection 854).

The DC power generator 806 may have a generator power connection 856 going outside of the module. For example, the DC power generator 806 may divert some power through generator power connection 856 if the IT load 802 does not need all of the power generated by the DC power generator 806. Alternately, the DC power generator 806 may divert all power through the power connection 856 if the IT load fails or goes offline for any reason. For example, in a shared scheme the DC power generator 806 may feed the IT load 802 as well as other customer loads. In an autonomous scheme, power from the DC power generator 806 may be fully utilized by the IT load 802 only.

Figure 9:
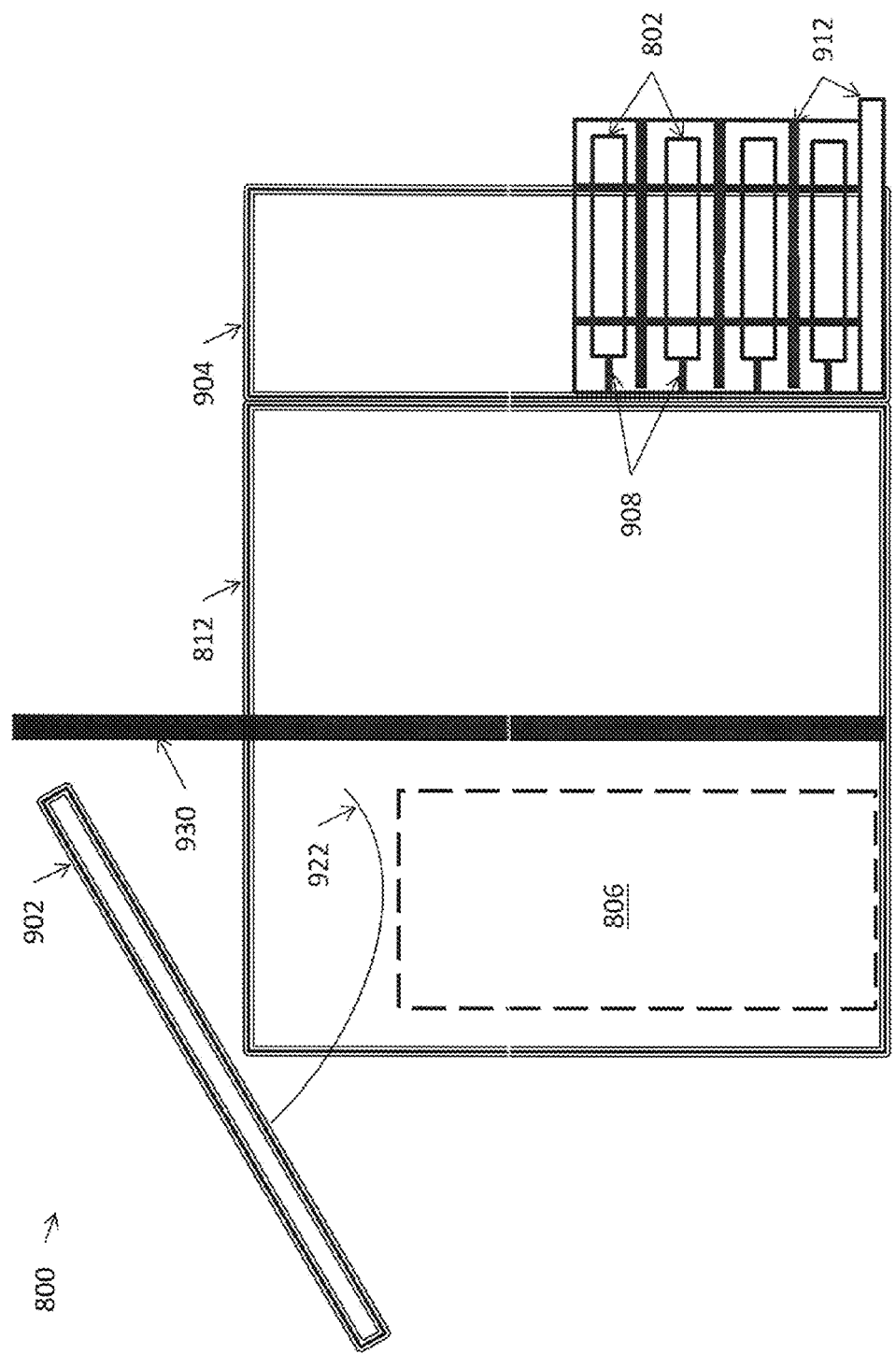
FIG. 9 is a side view of an embodiment module with an open front door.

FIG. 9 illustrates a side view of a module 800. The module 800 may include the housing 812, which may include a front door 902 and/or a rear access door 904. The front door 902 may swing up on multiple arms 922 as previously described with respect to FIG. 3. The front door 902 may allow direct access to the DC power generator 806.

The module may be partially indoors and partially outdoors. For example, a building wall 930 is shown in FIG. 9 with the module 800 extending to both sides of the wall with the front door 902 outdoors and the back door 904 indoors.

The back door 904 (shown open in FIG. 9) may allow access to the IT load 802. For example, the IT load 802 (e.g., servers) may be secured inside the module 800 to a rack 912. In some embodiments, the IT load 802 is positioned on a rack 912 able to slide out when the back door is open, as shown in FIG. 9. This may allow the IT load(s) to be connected or disconnected (i.e., plugged or unplugged) into one or more connections 908.

The front and/or back door may allow access to the DC power generator 806 and/or IT load 802 as well as the connections with each, such as the generator power connection 856, data connection 852, secondary power connection 854, fuel inlet 840, fuel exhaust 842, air inlet 844, and air exhaust 846. Alternatively, fuel and/or air may flow in or out via base 20 shown in FIG. 2. In some embodiments, the front and/or back door may contain ventilation openings and/or fans to assist the cooling system 820.

Figure 10A:
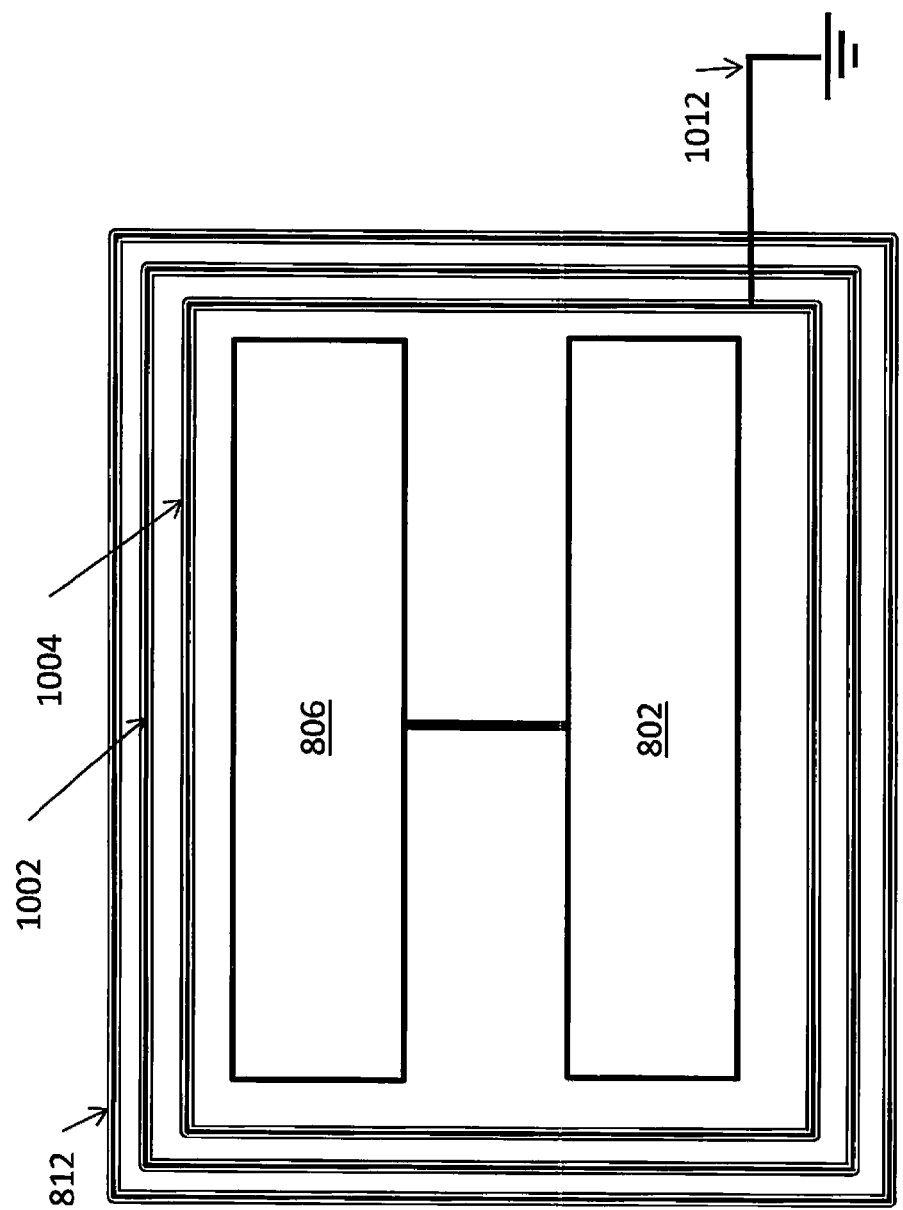
FIG. 10A is a schematic diagram on an embodiment module with EMP protection.

FIG. 10A illustrates how the system may incorporate EMP protection. For example, the housing 812 may include a Faraday cage 1002, such as a metal mesh enclosure inside the module 800. The module 800 may also include a shield of high magnetic permeability metal (e.g., mu-metal) 1004. The Faraday cage 1002 and magnetic shield 1004 may be connected to a ground 1012. Any data connections (e.g., data connection 852) may also be EMP protected.

Figure 10B:
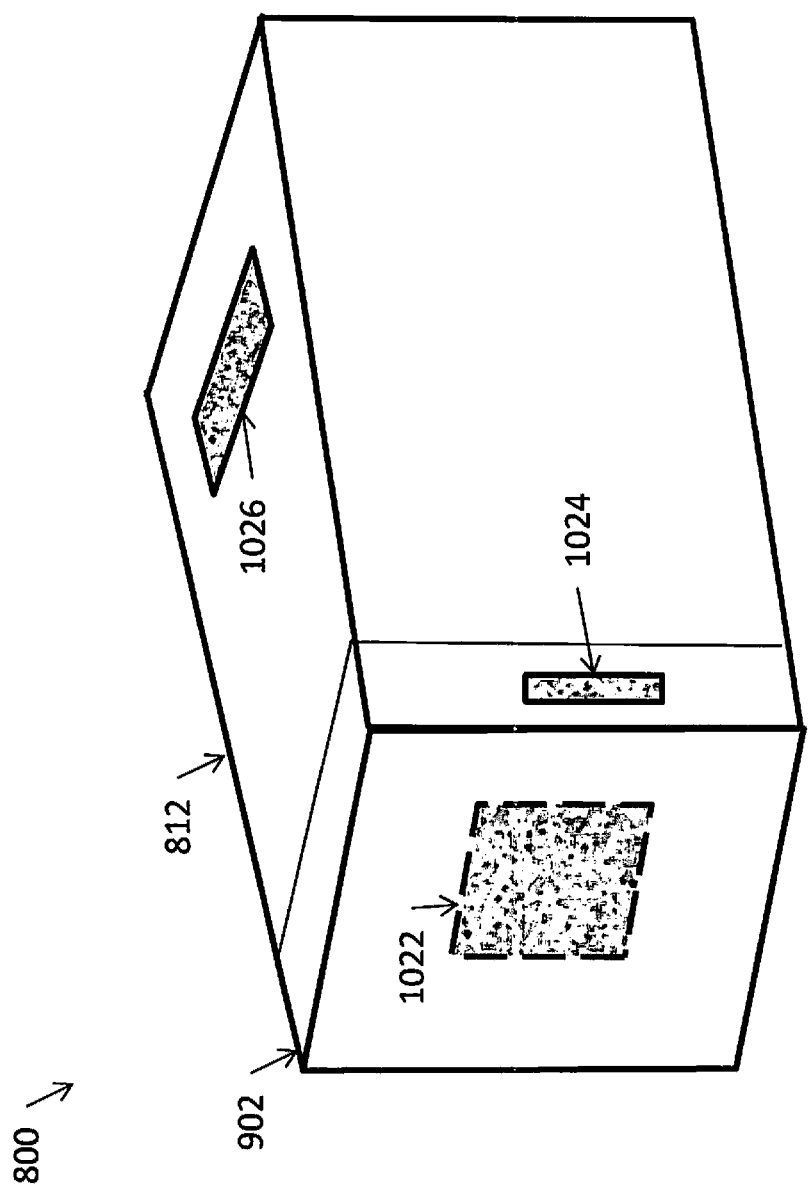
FIG. 10B is an oblique view of an embodiment module with EMP protective mesh over air inlets and outlets.

FIG. 10B illustrates EMP protection for air ways. The front door 902 of the module 800 may have a side vent 1024 for air intake. Air may travel through the side vent 1024 into the door and then through an interior door vent 1022 (shown with a dotted outline to indicate the vent is on the door's interior surface) and into the module, such as into the cooling system 820. Air may travel out of the module through a top vent 1026 on top of the module 800. In alternate embodiments, the direction of air may be reversed such that air goes in the top vent 1026 and out the side vent. The side vent 1024, interior door vent 1022, and top vent 1026 may be covered with a metal mesh (e.g., mu-metal or conductive metal such as the Faraday cage) to provide EMP protection while allowing air to pass.

Various embodiments may include dielectric plumbing in order to avoid coupling EMP energy via an antenna in the fuel piping. For example, various embodiments may rely on fiber optic data connections.

In further embodiments, one or more components inside the module 800 connected to a building management system. For example, a building management system may connect to the IT load 802 via data connection 852 or a separate connection, such as a separate data connection to the IT load 802 or the controller 822. The module may be controlled or monitored via this connection to a building management system. Alternately, the module 800 may report may make requests to the building management system, such as requesting additional power via secondary power connection 854 or fuel for the DC power generator 806.

In various embodiments, the module 800 may be connected with various fire detection or protection devices. For example, the module 800 may also include an emergency power off system. The emergency power off system may be internally triggered, such as by the controller 822 in response to a sensor reading, or externally triggered, such as by the building management system.

In further embodiments, the module may be configured to variably shift between supplying power and IT service. The module 800 could provide various combinations of power and IT service in response to customer needs in real time. For example, in one mode the module may supply only power (e.g., the DC power generator 806 may divert all power externally and the IT load 802 could be off). Alternately, all power could be provided to the IT load to be used to provide IT service. Alternately, the module could divide its output, such that some power is diverted externally while some is sent to the IT load 802 to provide IT service.

Figure 11:
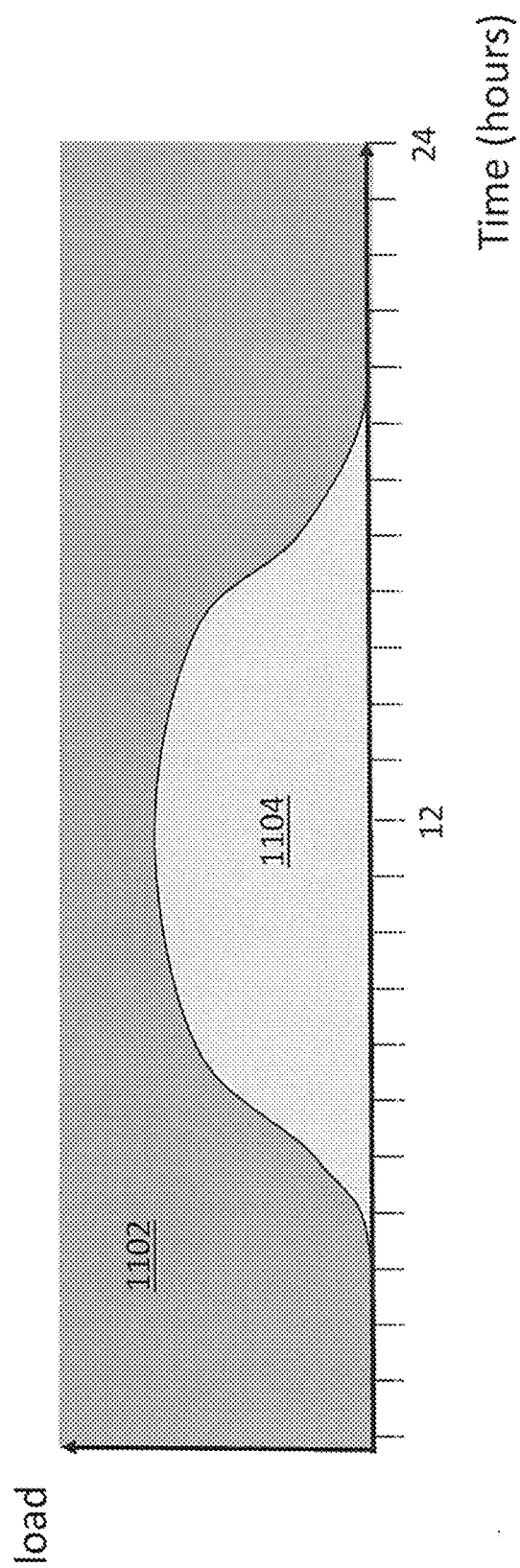
FIG. 11 is a graph of shifting power and IT service over time.

FIG. 11 is a graph of shifting power and IT service over time. As shown in the graph, the load may vary over time. For example, power from the DC power generator 806 may generally support an IT load 1102. However, power may be diverted to a secondary load 1104. For example, the secondary load 1104 may be an air conditioner whose power requirements vary with temperature. As shown in FIG. 11, the air conditioner may need more power during the day when it is hotter. At night, more power may be sent to the IT load.

Modules 800 in different locations may complement each other. For example, a module on the other side of the world may not need to power an air conditioner because it would be night, and therefore can provide more power to an IT load for IT service. This IT service may be shared in a cloud computing architecture. Alternately, demand for IT service may vary based on the time of day, and therefore multiple modules 800 in different locations could stagger providing more power to an IT load to meet demand.

In further embodiments, the module may be configured to variably shift between using power from a power source and fuel from a fuel source (i.e., shifting what is input, fuel or power, as opposed to what is output, power or IT service). For example, the module may rely on grid power as a power source if it becomes cheaper than fuel for the DC power generator 806.

In alternate embodiments, the module 800 may be located near a fuel or power source. For example, the module may be near a solar energy farm and the power source may be a solar cell. Alternately, the fuel source may be a hydrogen source from a nearby nuclear reactor or a hydrocarbon source from a nearby well or refinery. Modules located near fuel sources could effectively convert power into IT service without the losses associated with transmitting large amounts of power over distances. This IT services could be managed as part of a cloud computing architecture.

Figure 12:
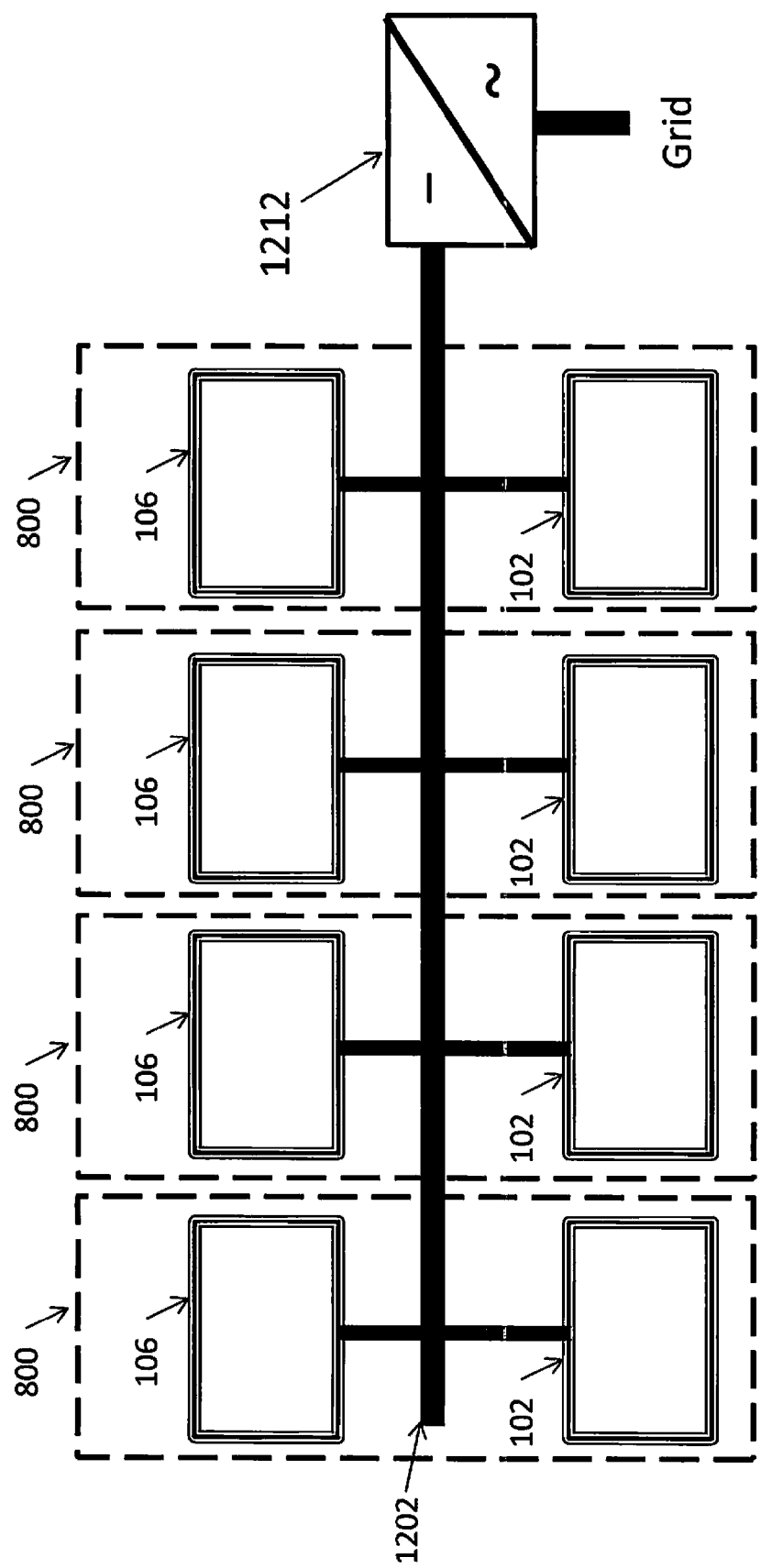
FIG. 12 is a diagram of several embodiments modules connected to a common bus.

In various embodiments, one or more modules 800 may provide power to a bus that is common to several modules such that the any DC power module 106 may supply power to any module's IT module. FIG. 12 illustrates several modules 800, including IT load modules 102 and power modules 106 connected by a common bus 1202. The bus 1202 may be connected to a DC/AC converter (i.e., inverter) to provide power to the grid. Further embodiments may include other cross connections to provide redundancy. For example, the secondary power connection 854 and/or generator power connection 856 may connect to other modules. In this way, operation may continue despite any single faults in the operation scheme.

The foregoing method descriptions and diagrams are provided merely as illustrative examples and are not intended to require or imply that the steps of the various embodiments must be performed in the order presented. As will be appreciated by one of skill in the art the order of steps in the foregoing embodiments may be performed in any order. Further, words such as "thereafter," "then," "next," etc. are not intended to limit the order of the steps; these words are simply used to guide the reader through the description of the methods.

One or more diagrams have been used to describe exemplary embodiments. The use of diagrams is not meant to be limiting with respect to the order of operations performed. The foregoing description of exemplary embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

Control elements may be implemented using computing devices (such as a computer) comprising processors, memory and other components that have been programmed with instructions to perform specific functions or may be implemented in processors designed to perform the specified functions. A processor may be any programmable microprocessor, microcomputer or multiple processor chip or chips that can be configured by software instructions (applications) to perform a variety of functions, including the functions of the various embodiments described herein. In some computing devices, multiple processors may be provided. Typically, software applications may be stored in the internal memory before they are accessed and loaded into the processor. In some computing devices, the processor may include internal memory sufficient to store the application software instructions.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some blocks or methods may be performed by circuitry that is specific to a given function.

The preceding description of the disclosed embodiments is provided to enable any person skilled in the art to make or use the described embodiment. Various modifications to these embodiments will be readily apparent to those skilled in the art, and the generic principles defined herein may be applied to other embodiments without departing from the scope of the disclosure. Thus, the present invention is not intended to be limited to the embodiments shown herein but is to be accorded the widest scope consistent with the following claims and the principles and novel features disclosed herein.

What is claimed is:

1. A combined power and IT modular system, comprising:
   a housing;
   an IT load in a data center comprising at least one server, a storage device and a network component comprising a router;
   a DC power generator which is electrically connected to the IT load, wherein the IT load and the DC power generator are both located in the housing; and
   a power connection configured to connect to a secondary load;
   wherein:
      the secondary load is provided in addition to an AC grid;
      the secondary load is located outside of the housing; and
      the IT modular system is configured to variably shift between supplying power to the IT load and supplying power to the secondary load by supplying an amount of power split among the IT load and the secondary load at a first time, then at a second time diverting a first portion of the amount of power less than 100% from the secondary load to the IT load as an amount of IT service is increased, and then at a third time diverting a second portion of the amount of power less than 100% from the IT load to the secondary load as an amount of power demand of the secondary load increases.

2. The system of claim 1, wherein the DC power generator comprises a fuel cell power generation system.

3. The system of claim 2, wherein the system is connected to a power source and a fuel source, and wherein the system is configured to variably shift between using power from the power source to power the IT load and fuel from the fuel source to generate power from the DC power generator for the IT load.

4. The system of claim 3, wherein the power source is at least one of a utility power grid or a solar cell.

5. The system of claim 3, wherein the fuel source is a hydrogen source from a nuclear reactor or a hydrocarbon source from a well or refinery.

6. The system of claim 1, wherein the DC power generator is configured to supply the IT load with bipolar 380V DC power or with unipolar 48V or 24V DC power.

7. The system of claim 1, further comprising an inverter, and wherein the DC power generator is configured to supply DC power to the inverter and the inverter is configured to supply AC power to the AC grid.

8. The system of claim 1, further comprising an inverter, and wherein the DC power generator is configured to supply DC power to the inverter and the inverter is configured to supply at least some AC power to the IT load.

9. The system of claim 1, further comprising at least one fan configured to direct air to cool the IT load.

10. The system of claim 9, wherein the system is configured such that the air to be directed by the at least one fan comes in through at least one low pressure drop door in the housing and a positive pressure is maintained within the housing.

11. The system of claim 9, further comprising a controller configured to shut off the IT load when the at least one fan ceases operating or to adjust the operation of the at least one fan based on a sensor.

12. The system of claim 9, further comprising at least one moist membrane or a cyclone separator.

13. The system of claim 1, further comprising at least one of a trim cooler, chiller, pre-chiller, and water circulation system.

14. The system of claim 13, wherein the system is configured such that air heated by the IT load is provided to the DC power generator.

15. The system of claim 13, wherein the system is configured such that air heated by the DC power generator is provided to the IT load.

16. The system of claim 1, wherein the IT load and the DC power generator are thermally integrated.

17. The system of claim 1, wherein the housing comprises a front door.

18. The system of claim 17, wherein the housing comprises a rear access door.

19. The system of claim 18, wherein the IT load is positioned on a rack able to slide out of the housing when the rear access door is open.

20. The system of claim 1, further comprising at least one of a Faraday cage inside the housing or a shield of high magnetic permeability metal.

21. The system of claim 1, wherein the system is electrically connected to a building management system.

22. A method of operating a combined power and IT module, comprising:
   providing a combined power and IT module, comprising:
      a housing;
      an IT load;
      a DC power generator which is electrically connected to the IT load, wherein the IT load and the DC power generator are both located in the housing; and
   operating the DC power generator to supply power to the IT load to provide IT service; and
   variably shifting between supplying power to the IT load and supplying power to a secondary load other than an AC grid, which comprises:
      supplying an amount of power split among the IT load and the secondary load at a first time;

then at a second time diverting a first portion of the amount of power less than 100% from the secondary load to the IT load as an amount of IT service is increased; and then at a third time diverting a second portion of the amount of power less than 100% from the IT load to the secondary load as an amount of power demand of the secondary load increases; and wherein the secondary load is located outside of the housing.

23. The method of claim 22, wherein the DC power generator comprises a fuel cell power generation system and the IT load comprises a data center comprising at least one server, a storage device, and a network component comprising a router.

24. The method of claim 23, wherein the module is connected to a power source and a fuel source, and further comprising shifting between a fuel mode in which the module uses fuel from the fuel source and a power mode in which the module uses power from the power source.

25. The method of claim 24, wherein the power source is at least one of a utility power grid or a solar cell.

26. The method of claim 24, wherein the fuel source is a hydrogen source from a nuclear reactor or a hydrocarbon source from a well or refinery.

27. The method of claim 22, wherein operating the DC power generator comprises supplying the IT load with bipolar 380V DC power or with unipolar 48V or 24V DC power by the DC power generator.

28. The method of claim 22, wherein the module further comprises an inverter, and further comprising:
supplying DC power to the inverter by the DC power generator; and
supplying AC power to the AC grid by the inverter.

29. The method of claim 22, wherein the module further comprises an inverter, and further comprising:
supplying DC power to the inverter by the DC power generator; and
supplying at least some AC power to the IT load by the inverter.

30. The method of claim 22, wherein the module further comprises at least one fan, and further comprising directing air to cool the IT load by the at least one fan.

31. The method of claim 30, further comprising:
directing air that comes in through at least one low pressure drop door with the at least one fan; and
maintaining a positive pressure within the housing.

32. The method of claim 30, further comprising:
shutting off the IT load when the at least one fan ceases operating; or
adjusting the operation of the at least one fan based on output of a sensor.

33. The method of claim 30, wherein the module further comprises at least one moist membrane or a cyclone separator.

34. The method of claim 22, wherein the module further comprises at least one of a trim cooler, chiller, pre-chiller, and water circulation system.

35. The method of claim 22, wherein the IT load and the DC power generator are thermally integrated.

36. The method of claim 35, further comprising providing air heated by the IT load to the DC power generator.

37. The method of claim 35, further composing providing air heated by the DC power generator to the IT load.

38. The method of claim 22, wherein the housing comprises a front door.

39. The method of claim 38, wherein the housing comprises a rear access door.

40. The method of claim 39, wherein the IT load is positioned on a rack able to slide out of the housing when the rear access door is open.

41. The method of claim 22, wherein the module further comprises at least one of a Faraday cage inside the housing or a shield of high magnetic permeability metal.

42. The method of claim 22, wherein the module is electrically connected to a building management system.

* * * * *